United States Patent
Nagasawa (10) Patent No.: US 10,505,443 B2
(45) Date of Patent: Dec. 10, 2019

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Hironori Nagasawa, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/118,931

(22) Filed: Aug. 31, 2018

(65) Prior Publication Data

US 2019/0280592 A1    Sep. 12, 2019

(30) Foreign Application Priority Data

Mar. 9, 2018    (JP) ................. 2018-043336

(51) Int. Cl.
*H02M 3/07* (2006.01)
*H03K 17/687* (2006.01)

(52) U.S. Cl.
CPC ............ *H02M 3/07* (2013.01); *H03K 17/687* (2013.01)

(58) Field of Classification Search
CPC .. H03K 17/687; H03K 17/693; H03K 17/063; H03K 17/102; H03K 5/08; H03K 3/02; H03K 17/06

USPC ........................ 327/108, 157, 427, 434, 537
See application file for complete search history.

(56) References Cited

U.S. PATENT DOCUMENTS

| 6,084,387 | A | * | 7/2000 | Kaneko ................. | H02M 3/073 323/274 |
| 7,714,637 | B2 | | 5/2010 | Kuriyama | |
| 8,754,838 | B2 | | 6/2014 | Kwon et al. | |
| 2004/0189390 | A1 | * | 9/2004 | Mallinson ............... | H03F 3/005 330/257 |

FOREIGN PATENT DOCUMENTS

| JP | 2007-282368 A | 10/2007 |
| JP | 4989927 B2 | 8/2012 |
| JP | 5213181 B2 | 6/2013 |

* cited by examiner

*Primary Examiner* — John W Poos
(74) *Attorney, Agent, or Firm* — White & Case LLP (57) ABSTRACT

According to one embodiment, a charge pump is configured to generate a negative potential at an output node. A first transistor and a first resistor are coupled in series in order between a first node and a second node. A second resistor is coupled between the second node and the output node. A second transistor and a third resistor are coupled in series in order between the first node and a third node. A fourth resistor is coupled between the third node and the output node. A third transistor is coupled between a fourth node and the output node, and coupled to the second node and the third node at a gate.

19 Claims, 8 Drawing Sheets

Negative potential generator

SEMICONDUCTOR DEVICE

CROSS-REFERENCE TO RELATED APPLICATIONS

This application is based upon and claims the benefit of priority from Japanese Patent Application No. 2018-43336, filed Mar. 9, 2018, the entire contents of which are incorporated herein by reference.

FIELD

Embodiments described herein relate generally to a semiconductor device.

BACKGROUND

A negative potential generator that generates a negative potential from a positive potential is known.

DETAILED DESCRIPTION

According to one embodiment, a charge pump is configured to generate a negative potential at an output node. A first transistor and a first resistor are coupled in series in order between a first node and a second node. A second resistor is coupled between the second node and the output node. A second transistor and a third resistor are coupled in series in order between the first node and a third node. A fourth resistor is coupled between the third node and the output node. A third transistor is coupled between a fourth node and the output node, and coupled to the second node and the third node at a gate.

Embodiments will now be described with reference to the figures.

In the following description, components with substantially the same functionalities and configurations will be referred to with the same reference numerals, and repeated descriptions may be omitted. Moreover, the entire description for a particular embodiment also applies to another embodiment unless it is explicitly mentioned otherwise or obviously eliminated.

It is not necessary that functional blocks are distinguished as in the following examples. For example, some of the functions may be implemented by functional blocks different from those illustrated below. Furthermore, an illustrated functional block may be divided into functional sub-blocks. The embodiments are not limited by the details of distinction of the functional blocks.

In the specification and the claims, a phrase of a particular first component being "coupled" to another second component includes the first component being coupled to the second component either directly or via one or more components which are always or selectively conductive.

First Embodiment

Figure 1:
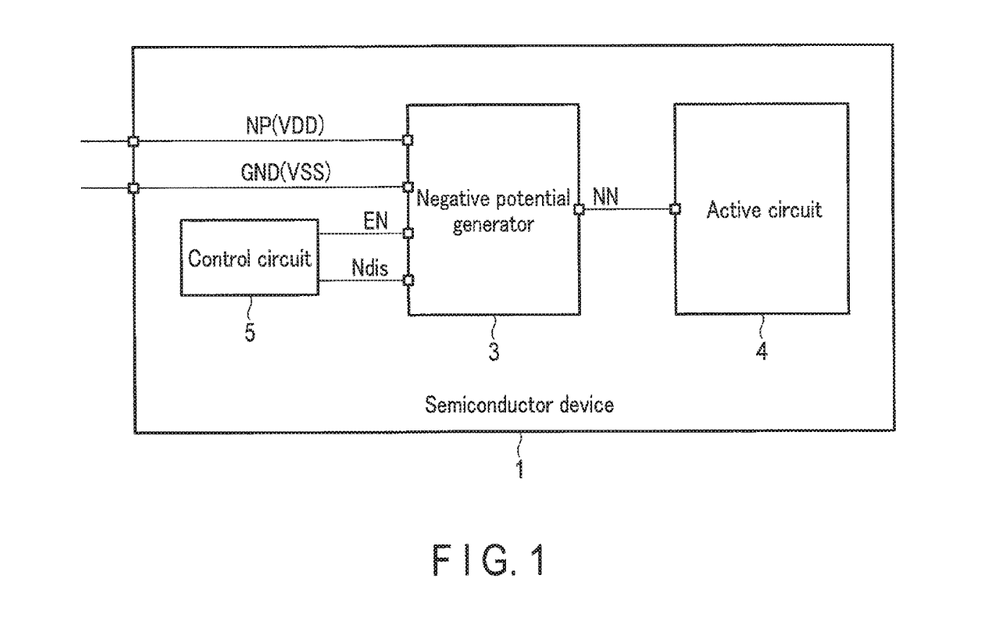
FIG. 1 illustrates a functional block of a part of a semiconductor device according to a first embodiment.

FIG. 1 illustrates a functional blocks of a part of a semiconductor device according to the first embodiment. As illustrated in FIG. 1, a semiconductor device 1 includes a semiconductor integrated circuit, and includes a negative potential generator 3, an active circuit 4, and a control circuit 5. The semiconductor device 1 is formed of, for example, a semiconductor chip. The semiconductor device 1 can receive, from the outside, a power supply potential VDD on a node NP, and a ground potential VSS (=0V) on a node GND.

The negative potential generator 3 is supplied with the power supply potential VDD and the ground potential VSS, and can generate a negative potential from the supplied power supply potential VDD and ground potential VSS. The generated negative potential is output from the negative potential generator 3 on a node NN. The negative potential generator 3 supplies the generated negative potential to the active circuit 4.

The active circuit 4 operates using the supplied negative potential. An example of the active circuit 4 includes an operational amplifying circuit. The operational amplifying circuit is supplied with a positive potential from the outside and a negative potential from the negative potential generator 3, and operates using the supplied positive and negative potentials.

The control circuit 5 controls components in the semiconductor device 1, and controls at least the negative potential generator 3 to control a potential on a node EN and a potential on a node Ndis of the negative potential generator 3.

Figure 2:
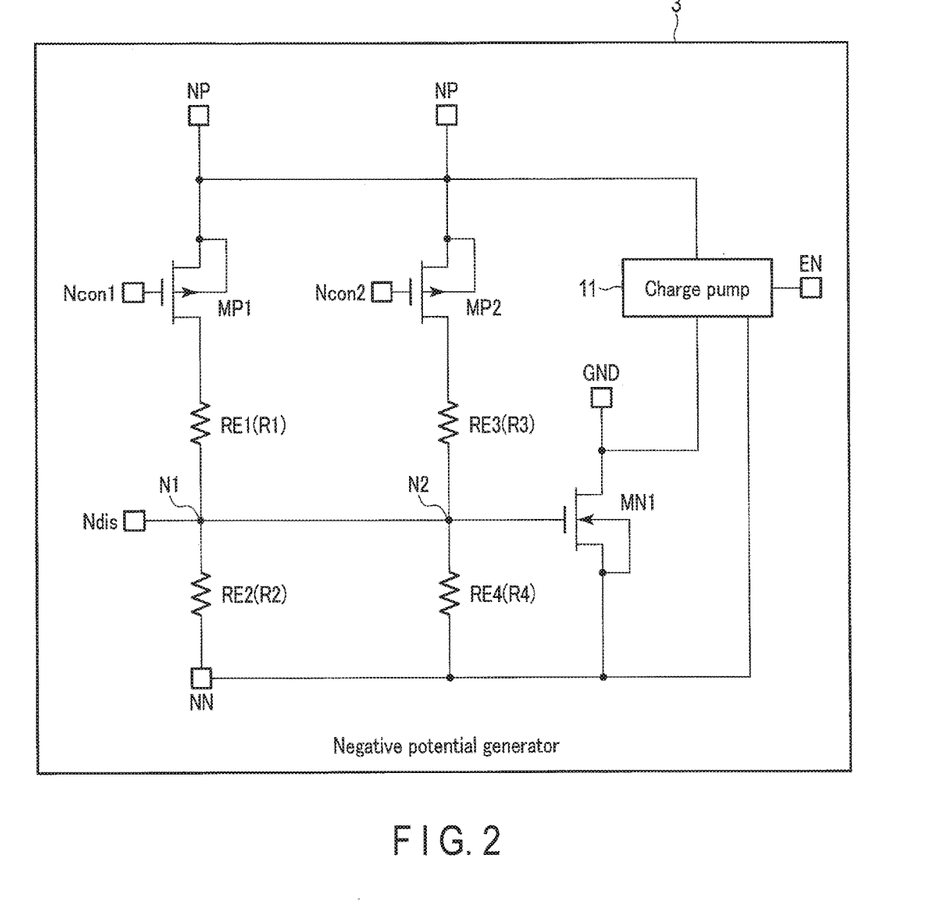
FIG. 2 is a circuit diagram of a negative potential generator according to the first embodiment.

FIG. 2 is a circuit diagram of the negative potential generator 3 according to the first embodiment, and illustrates its part by a functional block. As illustrated in FIG. 2, the negative potential generator 3 includes a charge pump 11, p-type metal oxide semiconductor field effect transistors (MOSFETs) MP1 and MP2, an n-type MOSFET MN1, and resistors RE1, RE2, RE3, and RE4. Each of the resistors RE1, RE2, RE3, and RE4 may be a resistor device or element, or the ON resistance of a transistor.

The charge pump 11 is coupled between the node NP and the node GND. In the following description, the node NP is referred to as a power supply potential node NP, and the node GND is referred to as a ground potential node GND. The charge pump 11 uses the power supply potential VDD and the ground potential VSS to generate the negative potential on a node NN. In the following description, the node NN is referred to as an output potential node NN. The charge pump 11 can have any structure as long as it can generate the negative potential, and the first embodiment is not limited by details of the charge pump 11.

The charge pump 11 receives a control signal from the control circuit 5 on the node EN. The control signal on the node EN controls the charge pump 11 so that the charge pump 11 is enabled or disabled, and is referred to as an enable signal. Specifically, the charge pump 11 operates, that is, generates the negative potential on the output potential node NN while receiving an asserted (e.g. high-level) enable signal, and the charge pump 11 does not operate while receiving a negated enable signal. In the following description, the node EN is referred to as an enable signal node EN.

The output potential node NN of the charge pump 11 is discharged based on the potential on the node Ndis. In the following description, the node Ndis is referred to as a discharge control node Ndis. The negative potential generator 3 receives the control signal from the control circuit 5 on the discharge control node Ndis. During the time when the negative potential generator 3 does not need to operate, the discharge control node Ndis is maintained at the ground potential VSS by the control circuit 5. On the other hand, with start of the operation of the negative potential generator 3, the discharge control node Ndis is released from the state in which the potential is maintained by the control circuit 5, and has a potential that varies based on the components in the negative potential generator 3.

The transistor MP1 and the resistor RE1 are coupled in series in this order between the power supply potential node NP and the node N1. The node N1 is also coupled to the discharge control node Ndis. The resistor RE1 has a resistance value R1. The resistance R1 is sufficiently larger than an ON resistance of the transistor MP1, i.e., R1>>ON resistance of the transistor MP1. The transistor MP1 is coupled to the node Ncon1 at the gate terminal. The node Ncon1 receives a digital control signal from the control circuit 5. The signal on the node Ncon1 is referred to as a signal Vcon1.

The resistor RE2 is coupled between the node N1 and the output potential node NN. The resistor RE2 has a resistance value R2. The resistance R2 is larger than the resistance R1.

The transistor MP2 and the resistor RE3 are coupled in series in this order between the power supply potential node NP and the node N2. The node N2 is also coupled to the discharge control node Ndis. The resistor RE3 has a resistance value R3. The resistance R3 is sufficiently larger than an ON resistance of the transistor MP2, i.e., R3>>ON resistance of the transistor MP2. The transistor MP2 is coupled to the node Ncon2 at the gate terminal. The node Ncon2 receives a digital control signal from the control circuit 5. The signal on the node Ncon2 is referred to as a signal Vcon2, and has a logic opposite to the logic of the signal Vcon1.

The resistor RE4 is coupled between the node N2 and the output potential node NN. The resistor RE4 has a resistance value R4. The resistance R4 is smaller than the resistance R3.

The transistor MN1 is coupled between the ground potential node GND and the output potential node NN. The gate terminal of the transistor MN1 is coupled to the discharge control node Ndis. The transistor MN1 has a threshold voltage Vth of, for example, approximately 0.55 V.

Figure 3:
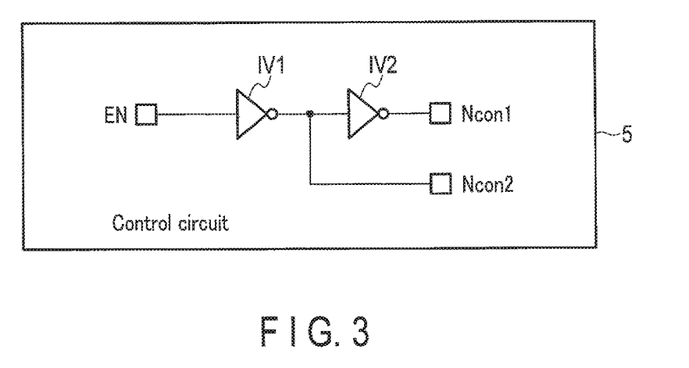
FIG. 3 is a circuit diagram of a part of a control circuit according to the first embodiment.

FIG. 3 is a circuit diagram of a part of the control circuit 5 according to the first embodiment. The control circuit 5 includes inverter circuits IV1 and IV2. An input of the inverter circuit IV1 is coupled to the enable signal node. An output node of the inverter circuit IV1 functions as the node Ncon2, and is coupled to an input node of the inverter circuit IV2. An output node of the inverter circuit IV2 functions as the node Ncon1.

The circuit of FIG. 3 may be a part of the negative potential generator 3. In this case, the negative potential generator 3 uses the enable signal on the enable signal node EN as an internal signal of the negative potential generator 3 to generate the signal Vcon1 on the node Ncon1 and the signal Vcon2 on the node Ncon2.

Figure 4:
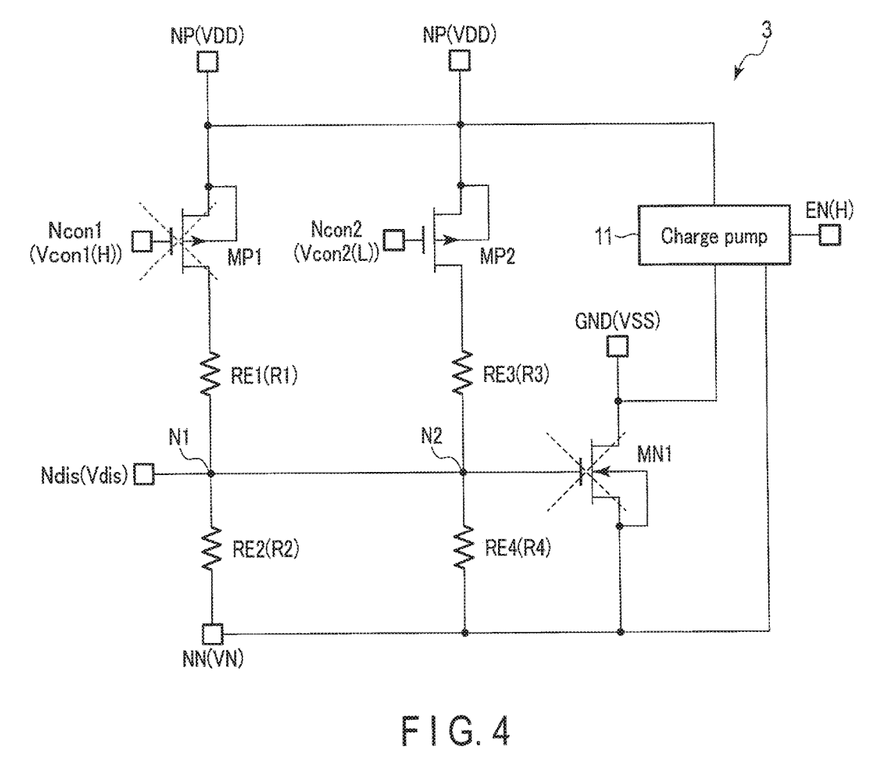
FIG. 4 illustrates a state of the negative potential generator according to the first embodiment.
Figure 5:
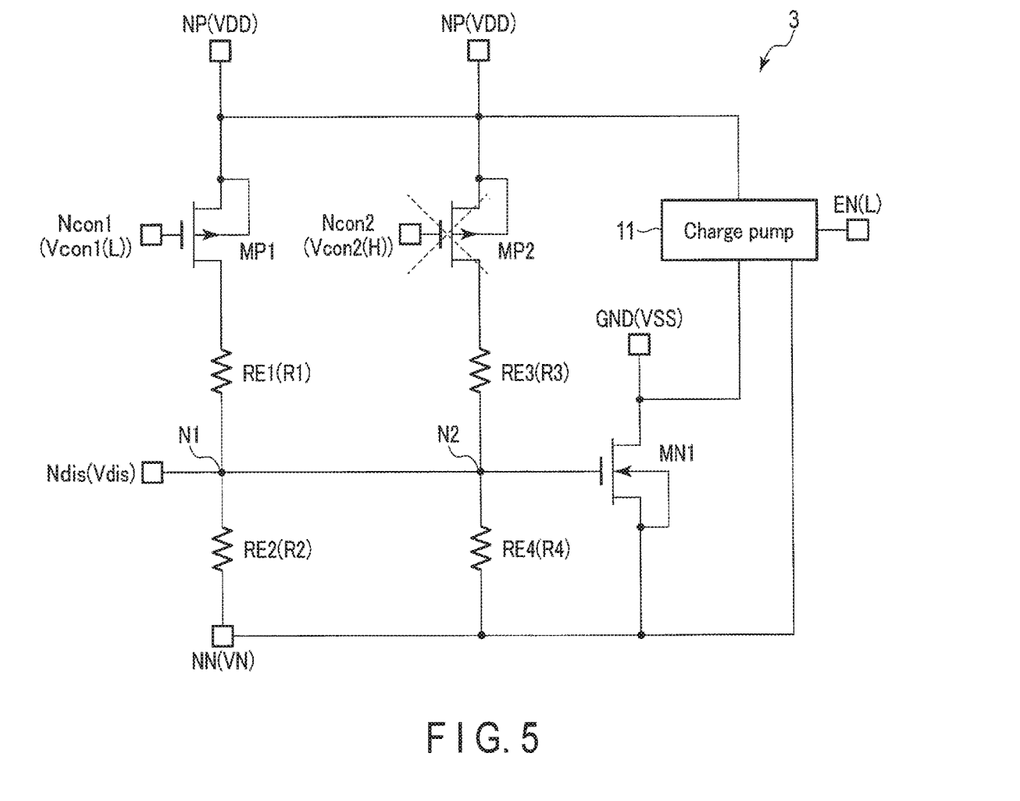
FIG. 5 illustrates a state of the negative potential generator according to the first embodiment.
Figure 6:
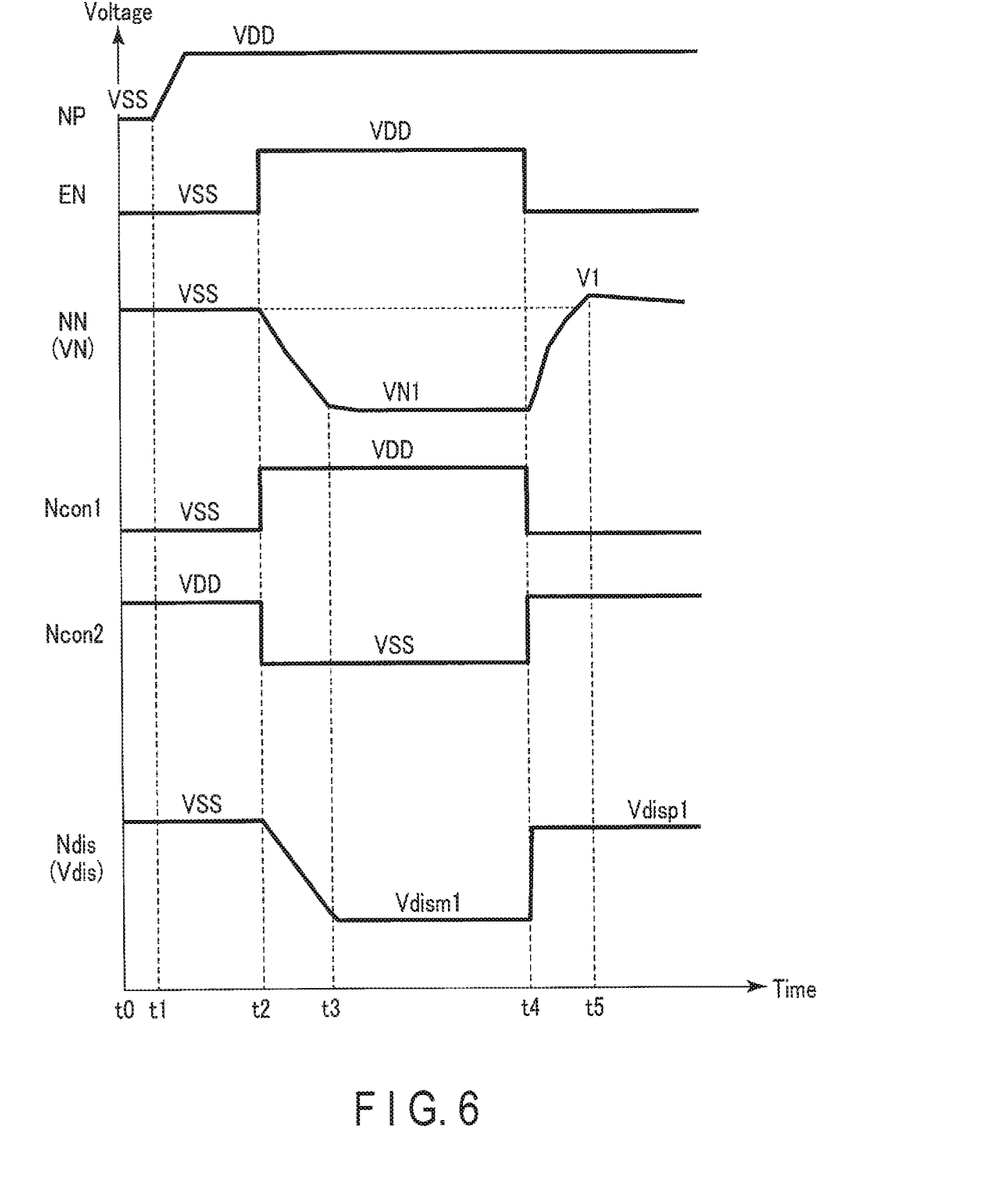
FIG. 6 illustrates potentials at some nodes of the negative potential generator according to the first embodiment over time.

With reference to FIG. 4 to FIG. 6, operations of the negative potential generator 3 will be described. First, with reference to FIG. 4 and FIG. 5, a description will be given of states during which the enable signal is at a high level and a low level, respectively. FIG. 4 and FIG. 5 illustrate states of the negative potential generator 3 during which the enable signal is at a high level and a low level, respectively. In the following description, a potential on the output potential node NN is referred to as an output potential VN, and a potential on the node Ndis is referred to as a potential Vdis. The output potential VN and the potential Vdis do not indicate potentials having certain fixed values, but indicate a potential of a variable value on the output potential node NN and a potential of a variable value on the discharge control node Ndis. During the time of FIG. 4 and FIG. 5, a potential on the discharge control node Ndis is not controlled from an outside (e.g., control circuit 5), and the discharge control node Ndis has a potential that is set by the state of the negative potential generator 3.

As illustrated in FIG. 4, the enable signal is at a high level, and thus the signal Vcon1 is at a high level (=power supply potential VDD), and the signal Vcon2 is at a low level (=ground potential VSS). Accordingly, the transistor MP1 is OFF, and the transistor MP2 is ON Since the transistor MP2 is ON, a part of the voltage between the power supply potential node NP and the output potential node NN appears on the discharge control node Ndis through the transistor MP2 and the resistors RE2, RE3, and RE4. On the other hand, since the transistor MP1 is OFF, the transistor MP1 and the resistor RE1 does not affect the discharge control node Ndis. Thus, the transistor MP1 is OFF, the transistor MP2 is ON, and the ON resistance of the transistor MP2<<R3 as described above. Therefore, on the discharge control node Ndis, a potential is generated, in which the potential is set by a ratio of a synthesized resistance of the resistances R2, R3, and R4. Specifically, the potential Vdis has the following value.

$$V\text{dis} = (VDD - VN) \times R2//R4/(R3 + R2//R4) + VN \quad (1)$$

Here, R2//R4 denotes a synthesized resistance of the resistances R2 and R4 coupled in parallel.

As an example, it is assumed that VDD=2 [V], R2=200 [kΩ], R3=500 [kΩ], R4=50 [kΩ], and the output potential VN while the charge pump 11 is stable is −3 [V]. Because R2//R4=40 [kΩ], Vdis=(2−(−3))×40 k/540 k−3=−2.64 [V]. Therefore, the gate-source voltage VGS of the transistor MN1 is −2.64−(−3)=0.36 [V]. Thus, based on the example in which the threshold voltage Vth of the transistor MN1 is 0.55 [V], the transistor MN1 remains OFF. Thus, the output potential node NN is not electrically coupled to the ground potential node GND, and the output potential node NN is not discharged and has a potential based on the operation of the charge pump 11.

As illustrated in FIG. 5, the enable signal is at a low level, and thus the signal Vcon1 is at a low level, and the signal Vcon2 is at a high level. Therefore, the transistor MP1 is ON, and the transistor MP2 is OFF.

Since the transistor MP1 is ON, a part of the voltage between the power supply potential node NP and the output potential node NN appears on the discharge control node Ndis through the transistor MP1 and the resistors RE1, RE2 and RE4. On the other hand, since the transistor MP2 is OFF, the voltage through the transistor MP2 and the resistor RE3 is not applied to the discharge control node Ndis. Thus, the transistor MP2 is OFF, the transistor MP1 is ON, and the ON resistance of the transistor MP1<<R1 as described above. Therefore, on the discharge control node Ndis, a potential is generated, in which the potential is set by a ratio of a synthesized resistance of the resistances R1, R2, and R4. Specifically, the potential Vdis has the following value.

$$Vdis=(VDD-VN)\times R2//R4/(R1+R2//R4)+VN \quad (2)$$

As an example, when R1=50 [kΩ], Vdis=(2−VN)×40 k/90 k+VN=0.89+0.56VN [V]. Thus, the gate-source voltage VGS of the transistor MN1 is 0.89+0.56VN−VN=0.89−0.44VN [V]. Thus, based on the example in which the threshold voltage Vth of the transistor MN1 is 0.55 [V], the transistor MN1 is ON while the relationship 0.89−0.44VN>0.55 is satisfied, that is, the transistor MN1 remains ON while VN<0.78 [V].

Next, with reference to FIG. 6, the operation of the negative potential generator 3 over time will be described. At the operation start time (time t0) of FIG. 6, the power supply potential node NP has a ground potential VSS, and the enable signal node EN has a low-level potential. Thus, the negative potential generator 3 is not operating, the output potential node NN has a ground potential VSS, the node Ncon1 has a low-level potential, and the node Ncon2 has a high-level potential. Furthermore, with start of the operation of FIG. 6, the potential of the discharge control node Ndis is released from the state in which the potential is maintained by the control circuit 5, and the potential varies by the operation of the negative potential generator 3.

Because of the potentials of the nodes as described above, the negative potential generator 3 is in the following state. The node Ncon1 is at the low level, and thus the transistor MP1 is ON. Since the transistor MP1 is ON, a part of the voltage between the power supply potential node NP and the output potential node NN may appear on the discharge control node Ndis through the transistor MP1 and the resistors RE1, RE2, and RE4. However, since the power supply potential node NP has the ground potential VSS, the discharge control node Ndis has the ground potential VSS. In addition, since the node Ncon2 is at the high level, the transistor MP2 is OFF. Thus, the voltage through the transistor MP2 and the resistors RE2, RE3, and RE4 is not applied to the discharge control node Ndis. The discharge control node Ndis thereby has the ground potential VSS. Since the discharge control node Ndis has the ground potential VSS, the transistor MN1 is OFF.

From time t1, application of the power supply potential VDD to the power supply potential node NP starts.

At time t2, the potential of the enable signal node EN is brought to a high level. As a result, the charge pump 11 starts operation, and the output potential VN decreases as the time elapses and reaches a potential VN1 at time t3, which is a timing when the operation of the charge pump 11 comes to be stable. The potential VN1 has a value set mainly by performance of the charge pump 11, and has a value which the negative potential generator 3 is intended to generate (e.g., −3 [V] as described above).

Furthermore, at time t2, the potential of the node Ncon1 is brought to a high level, and the potential of the node Ncon2 is brought to a low level. After the potential of the node Ncon1 is brought to the high level, the transistor MP1 is turned off at time t2. In addition, after the potential of the node Ncon2 is brought the low level, the transistor MP2 is turned on at time t2. Thus, on the discharge control node Ndis, the potential of the equation (1) appears.

As an example similar to that described above, when VDD=2 [V], R2=200 [kΩ], R3=500 [kΩ], and R4=50 [kΩ], Vdis=(2−VN)×40 k/540 k+VN=0.15+0.93VN [V]. Thus, the potential Vdis depends on the output potential VN, and decreases along a drop in the output potential VN during times t2 and t3. When the potential VN1 is −3 [v] as an example similar to that described above, the output potential VN is within the range from 0 [v] to −3 [V] during times t2 and t3. During this time, the potential Vdis of the discharge control node Ndis is within the range from 0.15 [V] to −2.64 [V]. During this range, the gate-source voltage VGS of the transistor MN1 is within the range from 0.15 [V] to 0.36 [V], and is constantly lower than the threshold voltage Vth (=0.55 [V]). Accordingly, the transistor MN1 remains OFF during times t2 and t3. Thus, the output potential node NN is not electrically coupled to the ground potential node GND, and is not discharged.

As described above, at time t3, the drop in the potential of the output potential node NN stops, and the output potential node NN has the potential VN1 (=−3 [V]). In association with this, the drop in the potential Vdis of the discharge control node Ndis stops, and at this time, the discharge control node Ndis has a potential Vdism1 (=−2.64 [V]).

At time t4, the potential of the enable signal node EN is brought to a low level. As a result, the charge pump 11 stops operation, and does not affect the output potential VN of the output potential node NN.

Furthermore, at time t4, the potential of the node Ncon1 is brought to a low level, and the potential of the node Ncon2 is brought to a high level. After the potential of the node Ncon1 is brought to the low level, the transistor MP1 is turned on at time t4. In addition, after the potential of the node Ncon2 is brought to the high level, the transistor MP2 is turned off at time t4. Thus, on the discharge control node Ndis, the potential of the equation (2) appears.

As an example similar to that described above, when R1=50 [kΩ], Vdis=(2−VN)×40 k/90 k+VN=0.89+0.56VN [V]. At the moment of time t4, the output potential VN is the potential VN1 (=−3 [V]), and thus, at time t4, the potential Vdis (=Vdisp1) of the discharge control node Ndis increases to −0.79 [V].

At the moment of time t4, the output potential VN is −3 [V]. Accordingly, the conditions in which the transistor MN1 remains ON, i.e., the gate-source voltage VGS>the threshold voltage Vth (=0.55 [V]) and VN<0.78 [V] are satisfied, and thus the transistor MN1 is turned on. Therefore, the output potential node NN is electrically coupled to the ground potential node GND, and the output potential VN starts to increase.

Until the output potential VN becomes at least 0 [V] from −3 [V] when the discharge starts, the relationship VN<0.78 [V] is constantly satisfied, which is the condition in which the transistor MN1 remains ON. Thus, until the output potential VN increases to 0 [V], the transistor MN1 remains ON, and the discharge path via the transistor MN1 is maintained.

To ensure that the output potential VN is discharged to 0 [V], values of the resistances R1 and R2 can be determined so that the transistor MN1 is turned off when the output potential node becomes a potential V1 having a positive value. To achieve this, the resistances R1, R2, and R4 can be selected to satisfy the gate-source voltage VGS=(2−V1)× R2//R4/(R1+R2//R4)≥0.55. Note that the potential V1 needs to be smaller than an on-voltage of a PN junction of the transistor MN1 or below. This is because if the potential V1 exceeds the on-voltage of the PN junction of the transistor MN1, a current constantly flows through the PN junction of the transistor MN1, and the transistor MN1 does not operate as a transistor.

FIG. 6 shows such an example, that is, the output potential VN continues to increase after exceeding 0 [V], and reaches the potential V1 at time t5. Then, at time t5, the gate-source voltage VGS falls below the threshold voltage Vth, and the transistor MN1 is turned off.

According to the first embodiment, as will be discussed below, the negative potential generator 3 having a simple structure can be realized.

Figure 7:
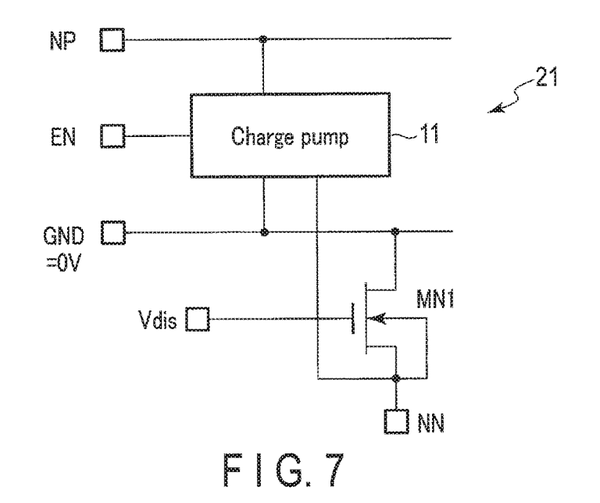
FIG. 7 is a circuit diagram of a negative potential generator for reference.

As illustrated in FIG. 7, a negative potential generator 21 having a structure different from that of the negative potential generator 3 is considered. That is, the charge pump 11 is coupled between the node NP and the ground potential node GND, and outputs the negative potential on the output potential node NN. The output potential node NN is coupled to the ground potential node GND through the transistor MN1. The negative potential generator 21 does not include transistors MP1 and MP2 or resistors RE1 to RE4 as illustrated in FIG. 3. The potential of the discharge control node Ndis is controlled by a circuit other than the negative potential generator 21.

Figure 8:
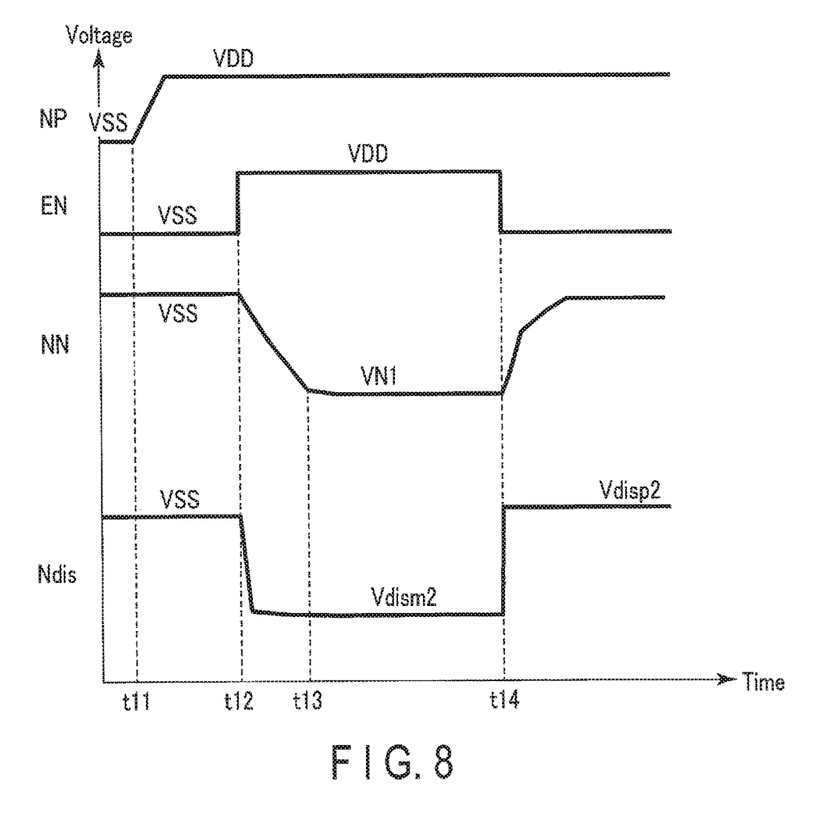
FIG. 8 illustrates potentials at some nodes of the negative potential generator for reference.

FIG. 8 illustrates potentials at some nodes during the operation of the negative potential generator 21 over time. The operations at times t11, t12, t13, and t14 correspond to the operations at times t1, t2, t3, and t4 of the negative potential generator 3 (FIG. 6). During times t12 to t14, the charge pump 11 is operating, and during this time, the output potential node NN needs to be electrically cut off from the ground potential node GND. Thus, the transistor MN1 needs to remain OFF. For this, the potential at the discharge control node Ndis, i.e., at the gate terminal of the transistor MN1, needs to be maintained at a potential Vdism2, which is lower than the potential VN1 on the output potential node NN while the operation of the charge pump 11 is stable plus threshold voltage Vth. Similar to the example described with reference to FIG. 6, in the case where the potential VN1 is low and |VN1|>Vth, VN1+Vth<0, and thus Vdism2<0 is required. That is, a negative power source for applying the negative potential Vdism2 to the discharge control node Ndis is necessary.

For generation of the negative potential Vdism2, it is considered to provide another negative potential generator in addition to the negative potential generator 3. However, a further negative potential generator being necessary for operation of the negative potential generator 21 used as a power source of the circuit requires a large circuit size for the negative potential generator 21 and a large amount of consumption current for operation of the negative potential generator 21. The negative potential generator for generating the negative potential Vdism2 has a smaller load than that of the negative potential generator 21, and thus the size can be smaller than that of the negative potential generator 21. However, a further negative potential generator is still necessary for operation of the negative potential generator 21.

According to the first embodiment, the negative potential generator 3 includes the transistor MP1 and the resistors RE1 and RE2 coupled in series between the power supply potential node NP and the output potential node NN, and the transistor MP2 and the resistors RE3 and RE4 coupled in series between the power supply potential node NP and the output potential node NN. The node N1 between the resistors RE1 and RE2 and the node N2 between the resistors RE3 and RE4 are coupled to the gate terminal of the transistor MN1, and the transistors MP1 and MP2 are turned on exclusively during the operation and discharge of the charge pump 11. By adjusting the resistances R1 to R4, the discharge control node Ndis is autonomously maintained at the potential at which the transistor MN1 remains OFF during the operation of the charge pump 11, and at the potential at which the transistor MN1 remains ON during the discharge of the charge pump 11. Thus, the output potential node NN does not require a further negative potential generator, and maintains a state in which the output potential node NN is electrically cut off from the ground potential node GND during the operation of the charge pump 11 and a state in which the output potential node NN is electrically coupled to the ground potential node GND during the discharge. Therefore, the negative potential generator 3 having a simple structure can be realized.

Second Embodiment

Figure 9:
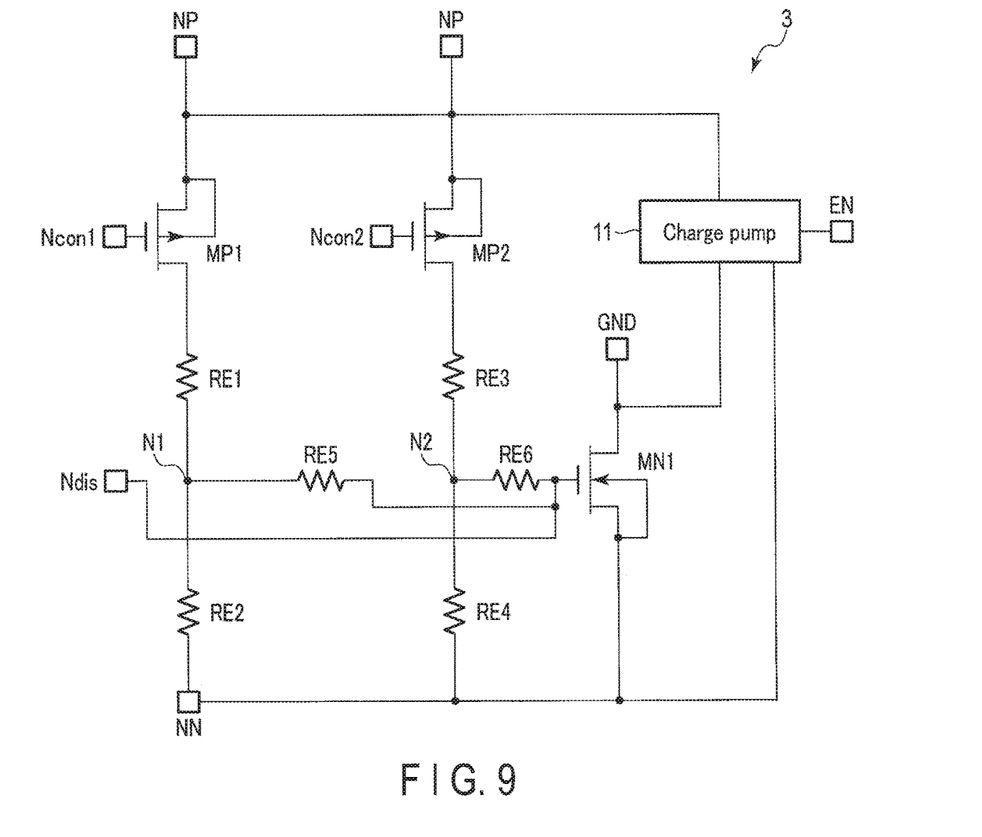
FIG. 9 is a circuit diagram of a negative potential generator according to a second embodiment.

FIG. 9 is a circuit diagram of the negative potential generator 3 according to the second embodiment, and illustrates its part by a functional block. The negative potential generator 3 of the second embodiment includes resistors RE5 and RE6, in addition to the components and the couplings of the first embodiment (FIG. 2). The node N1 between the resistors RE1 and RE2 is not coupled to the discharge control node Ndis of the first embodiment, but is coupled to the gate terminal of the transistor MN1 through the resistor RE5. The node N2 between the resistors RE3 and RE4 is not coupled to the discharge control node Ndis of the first embodiment, but is coupled to the gate terminal of the transistor MN1 through the resistor RE6. The discharge control node Ndis is coupled to the gate terminal of the transistor MN1.

Similar to the first embodiment, the negative potential generator 3 of the second embodiment includes the transistor MP1 and the resistors RE1 and RE2 coupled in series between the power supply potential node NP and the output potential node NN, and the transistor MP2 and the resistors RE3 and RE4 coupled in series between the power supply potential node NP and the output potential node NN. The node N1 between the resistors RE1 and RE2 and the node N2 between the resistors RE3 and RE4 are electrically coupled to the gate terminal of the transistor MN1, and the transistors MP1 and MP2 are turned on exclusively during the operation and discharge of the charge pump 11. Thus, the second embodiment achieves the same advantageous features as in the first embodiment.

Furthermore, according to the second embodiment, the node N1 is coupled to the gate terminal of the transistor MN1 through the resistor RE5, and the node N2 is coupled to the gate terminal of the transistor MN1 through the resistor RE6. For noise caused on the nodes N1 and N2 when the potentials of the nodes Ncon1 and Ncon2 transition between high and low levels, it is possible to prevent the noise from being transmitted to the gate terminal of the transistor MN1. Therefore, it is possible to improve ON and OFF switching characteristics of the transistor MN1.

Third Embodiment

Figure 10:
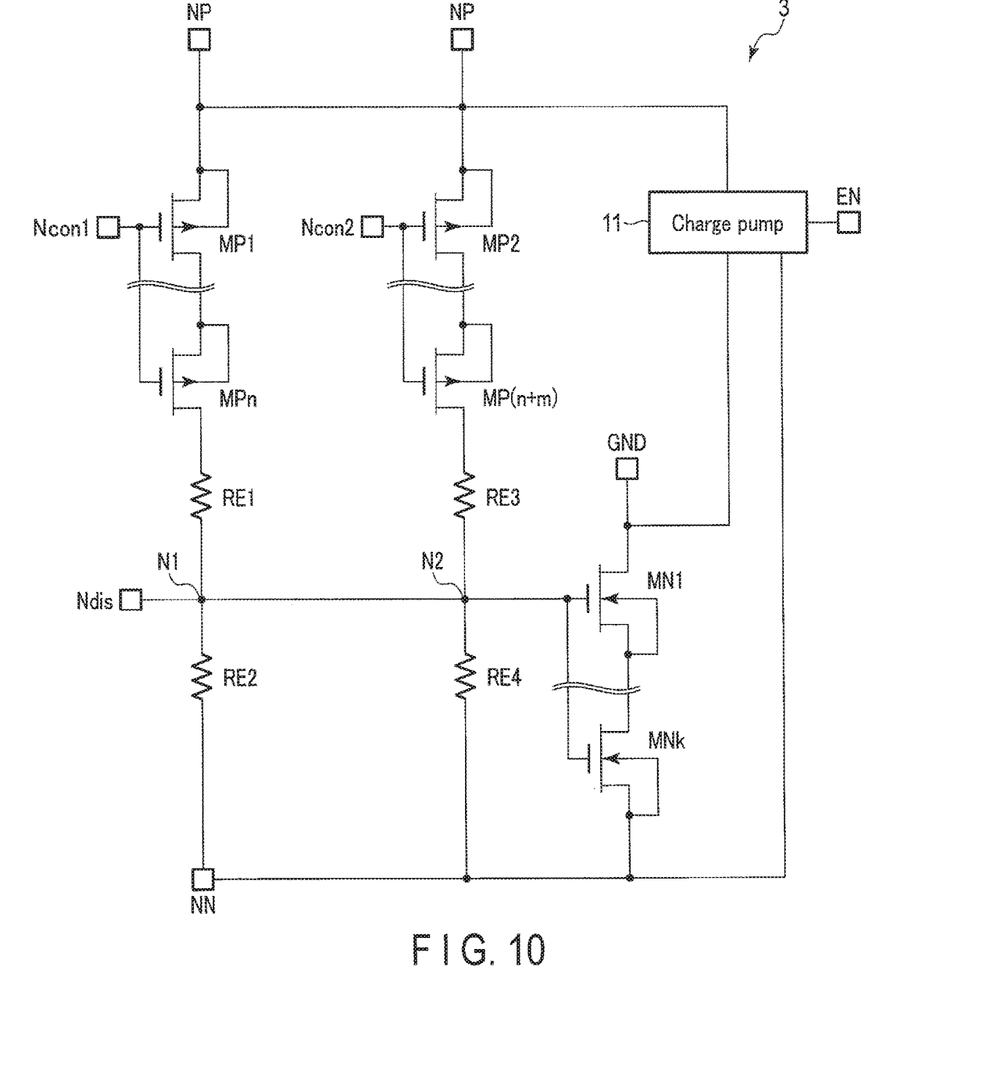
FIG. 10 is a circuit diagram of the negative potential generator according to the second embodiment.

FIG. 10 is a circuit diagram of the negative potential generator 3 according to the third embodiment, and illustrates a part by a functional block. The negative potential generator 3 of the third embodiment includes at least one of p-type MOSFET Mpn and MP(n+m) and n-type MOSFET MNks, in addition to the components and the couplings of the first embodiment (FIG. 2). n is a natural number of 3 or more, m is a natural number of 1 or more, and k is a natural number of 2 or more.

The transistors MP1, MP3, MP4, . . . MPn are coupled in series between the power supply potential node NP and the resistor RE1, and are coupled to the node Ncon1 at the gate terminals. The transistors MP2, MP(n+1), MP(n+2), . . . MP(n+m) are coupled in series between the power supply potential node NP and the resistor RE3, and are coupled to the node Ncon2 at the gate terminals. The transistors MN1 to MNk are coupled in series between the ground potential node GND and the output potential node NN, and are coupled to the nodes N1 and N2 and the discharge control node Ndis at the gate terminals.

Of the transistors MP1 to MP(n+m) and the transistors MN1 to MNk, only discretionary transistors other than the transistors MP1, MP2, and MN1 may be provided.

The third embodiment may be combined with the second embodiment.

Similar to the first embodiment, the negative potential generator 3 of the third embodiment includes the transistors MP1 to MPn and the resistors RE1 and RE2 coupled in series between the power supply potential node NP and the output potential node NN, and the transistors MP2 to MP(n+m) and the resistors RE3 and RE4 coupled in series between the power supply potential node NP and the output potential node NN. The node N1 between the resistors RE1 and RE2 and the node N2 between the resistors RE3 and RE4 are electrically coupled to the gate terminal of the transistor MN1, and the transistors MP1 and MP2 are turned on exclusively during the operation and discharge of the charge pump 11. Thus, the third embodiment achieves the same advantageous features as in the first embodiment.

According to the third embodiment, cascoded transistors are provided between the power supply potential node NP and the resistor RE1, and/or between the power supply potential node NP and the resistor RE3, and/or between the ground potential node GND and the output potential node NN. In the case where the transistors MP1 to MPn are provided, the voltage applied to each of the transistors MP1 to MPn is lower than in the case where a single transistor MP1 is provided. In addition, in the case where the transistors MP2 to MP(n+m) are provided, the voltage applied to each of the transistors MP2 to MP(n+m) is lower than in the case where a single transistor MP2 is provided. Moreover, in the case where the transistors MN1 to MNk are provided, the voltage applied to each of the transistors MN1 to MNk is lower than in the case where a single transistor MN1 is provided. Accordingly, a difference between the power supply potential VDD and the potential VN1 can be larger than in the case where the transistors MP1, MP2, and MN1 are only provided, without setting the withstand voltages of the transistors MP1 to MP(n+m) to be higher than those of the transistors MP1 and MP2, and without setting the withstand voltages of the transistors MN1 to MNk to be higher than that of the transistor MN1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a charge pump configured to generate a negative potential at an output node;
a first transistor and a first resistor coupled in series in order between a first node and a second node;
a second resistor between the second node and the output node;
a second transistor and a third resistor coupled in series in order between the first node and a third node;
a fourth resistor between the third node and the output node; and
a third transistor coupled between a fourth node and the output node, and coupled to the second node and the third node at a gate, wherein
the first transistor receives a first signal at a gate, and
the second transistor receives, at a gate, a second signal having a logic opposite to a logic of the first signal.

2. The device according to claim 1, wherein
the charge pump generates the negative potential while receiving a signal having a same logic as the logic of the first signal.

3. The device according to claim 1, wherein
the first resistor has a resistance lower than a resistance of the second resistor, and
the third resistor has a resistance higher than a resistance of the fourth resistor.

4. The device according to claim 1, wherein
the first resistor has a resistance higher than a resistance of the first transistor while the first transistor is ON, and
the third resistor has a resistance higher than a resistance of the second transistor while the second transistor is ON.

5. The device according to claim 1, wherein
the first transistor and the second transistor are p-type MOSFETs, and
the third transistor is an n-type MOSFET.

6. The device according to claim 1, wherein
the fourth node is supplied with a ground potential.

7. The device according to claim 1, wherein
the fourth node is supplied with a potential lower than a potential applied to the first node.

8. The device according to claim 1, wherein
the first node is supplied with a power supply potential.

9. The device according to claim 1, wherein
the charge pump is coupled between the first node and the fourth node.

10. The device according to claim 1, wherein
the charge pump generates the negative potential while receiving a signal having a same logic as the logic of the first signal,
the first resistor has a resistance lower than a resistance of the second resistor, and
the third resistor has a resistance higher than a resistance of the fourth resistor.

11. The device according to claim 10, wherein
the first resistor has a resistance higher than a resistance of the first transistor while the first transistor is ON, and
the third resistor has a resistance higher than a resistance of the second transistor while the second transistor is ON.

12. The device according to claim 1, further comprising a fifth resistor between the second node and the gate of the third transistor.

13. The device according to claim 1, further comprising a fifth resistor between the third node and the gate of the third transistor.

14. The device according to claim 13, further comprising a sixth resistor between the second node and the gate of the third transistor.

15. The device according to claim 1, further comprising a fourth transistor directly coupled in order between the first transistor and the first resistor, and including a gate coupled to the gate of the first transistor.

16. The device according to claim 1, further comprising a fourth transistor directly coupled in order between the second transistor and the third resistor, and including a gate coupled to the gate of the second transistor.

17. The device according to claim 16, further comprising a fifth transistor directly coupled in order between the first transistor and the first resistor, and including a gate coupled to the gate of the first transistor.

18. The device according to claim 1, further comprising a fourth transistor directly coupled in order between the third transistor and the output node, and including a gate coupled to the gate of the third transistor.

19. The device according to claim 1, wherein
the third transistor is OFF while the charge pump is operating, and the third transistor is ON while the charge pump is not operating.

\* \* \* \* \*